United States Patent [19]

Hall

[11] 4,152,823

[45] May 8, 1979

[54] HIGH TEMPERATURE REFRACTORY METAL CONTACT ASSEMBLY AND MULTIPLE LAYER INTERCONNECT STRUCTURE

[75] Inventor: John H. Hall, Saratoga, Calif.

[73] Assignee: Micro Power Systems, Santa Clara, Calif.

[21] Appl. No.: 791,798

[22] Filed: Apr. 28, 1977

Related U.S. Application Data

[60] Division of Ser. No. 585,612, Jun. 10, 1975, Pat. No. 4,042,953, which is a continuation of Ser. No. 384,640, Aug. 1, 1973, abandoned.

[51] Int. Cl.² ............................................ B01J 17/00
[52] U.S. Cl. ...................................... 29/571; 29/577; 29/578; 29/589
[58] Field of Search ................. 29/571, 577, 578, 589, 29/590; 357/71

[56] References Cited

U.S. PATENT DOCUMENTS

| | | | |
|---|---|---|---|
| 3,461,361 | 8/1969 | Delivorias | 29/571 |
| 3,614,547 | 10/1971 | May | 357/71 |
| 3,667,008 | 5/1972 | Katnack | 357/71 |

Primary Examiner—W. Tupman
Attorney, Agent, or Firm—Flehr, Hohbach, Test, Albritton & Herbert

[57] ABSTRACT

A multi-layer integrated semiconductor circuit interconnection structure with a first layer formed of a refractory metal sandwich including outer layers of silicon and a core of refractory metal providing a high temperature low ohmic contact assembly, an insulating layer formed on the first layer, and a patterned metal layer formed on the insulating layer to interconnect with the refractory layer and semiconductor device to provide an integrated circuit assembly.

1 Claim, 7 Drawing Figures

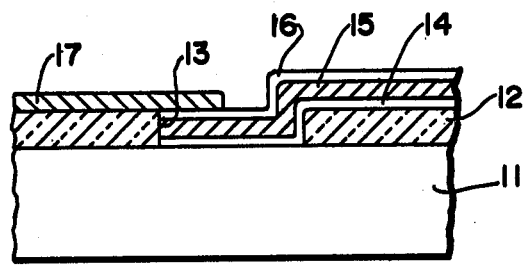
FIG.—1
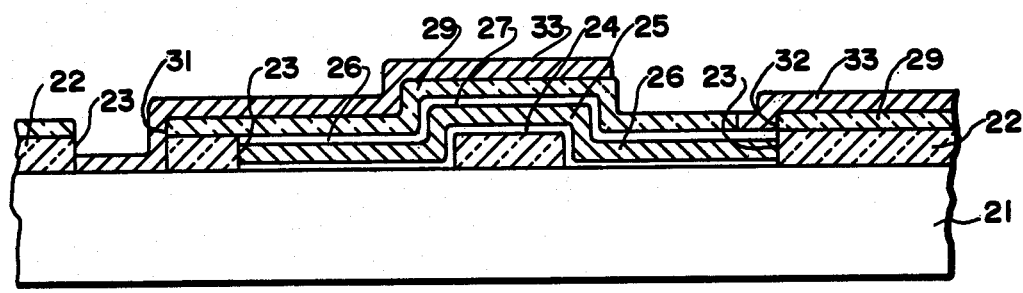
FIG.—2
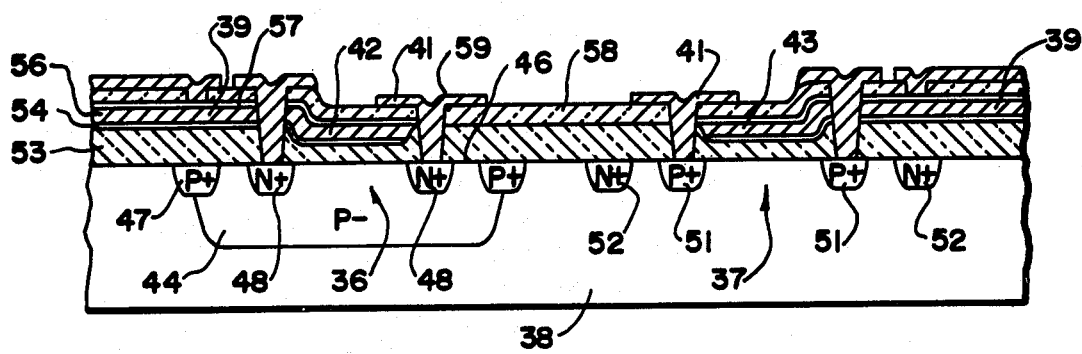
FIG.—3

HIGH TEMPERATURE REFRACTORY METAL CONTACT ASSEMBLY AND MULTIPLE LAYER INTERCONNECT STRUCTURE

REFERENCE TO RELATED APPLICATIONS

This is a division of copending application Ser. No. 585,612 filed June 10, 1975, now U.S. Pat. No. 4,042,953, for "HIGH TEMPERATURE REFRACTORY METAL CONTACT ASSEMBLY AND MULTIPLE LAYER INTERCONNECT STRUCTURE" which was a continuation of Ser. No. 384,640 filed Aug. 1, 1973 "HIGH TEMPERATURE REFRACTORY METAL CONTACT ASSEMBLY AND MULTIPLE LAYER INTERCONNECT STRUCTURE", now abandoned.

BACKGROUND OF THE INVENTION

This invention relates generally to an integrated circuit interconnection structure including multiple metal layers and more particularly to a multiple layer interconnection structure including a high temperature low ohmic refractory metal contact assembly and interconnect layers cooperating with the structure and contact assembly.

It is well known that a multi-layer integrated circuit interconnection structure is desirable to improve circuit performance as well as to increase circuit density. Prior art structures include etched contact holes formed in an oxide-coated wafer surface, a layer of aluminum formed on the oxide surface and in the contact holes to form contacts with selected regions of the wafer. The aluminum layer is patterned to interconnect specific portions of the integrated circuit. This contact and interconnection structure has not been especially satisfactory for many applications because the highly reactive aluminum pits the silicon oxide during high temperature processing reducing the structure's breakdown voltage. Subsequent processing steps such as passivation and multi-layer interconnection increases the reaction between the aluminum and the silicon oxide. Elevated temperatures required for some processing steps, of the order of 900° C., further promote aluminum and oxide reaction. The aluminum may recrystallize in formations which crack the insulating layer separating multiple metal layers. Thus, the use of aluminum contacts and interconnections severely restricts subsequent processing steps at elevated temperatures.

Prior art complementary MOS and metal layer structures include the silicon gate structure having the surface of the semiconductor body lined with a silicon layer forming a gate structure. The first metallization layer is formed of silicon in a process step prior to the step of forming source and drain regions extending into the semiconductor body. The surface lined silicon gate structure limits the flexibility and density of complementary MOS circuits. Because the first layer of metal cannot cross the channel stops, the surface silicon gate structure can prevent the use of isolating channel stops surrounding the complementary MOS transistors. If channel stops are used, silicon gate reserves the first metallization layer solely for contacting the transistor gates, again because the first layer of metal cannot cross in the same plane the isolating channel stops. The silicon gate structure, when combined with channel stops, severely restricts the possible metallization interconnections in complementary MOS circuits.

OBJECTS AND SUMMARY OF THE INVENTION

It is a general object of the present invention to provide improved ohmic contact, multi-layer interconnection structure for integrated circuits and method of fabrication.

It is another object of the present invention to provide a multi-layer interconnection structure in combination with a complementary MOS transistor structure including high performance isolated transistors and a highly flexible and fully compatible multi-layer interconnection structure.

It is another object of the present invention to provide a method of fabricating integrated circuits including complementary MOS transistors having ohmic contacts and multi-layer interconnections into an integrated circuit.

The foregoing and other objects of the invention are achieved by a multi-layer interconnection structure including an interconnecting layer comprising refractory metal having outer layers of silicon interconnecting selected portions of semiconductor material, and at least a second conductive layer interconnecting selected portions of the semiconductor material and selected portions of the refractory metal layer.

BRIEF DESCRIPTION OF THE DRAWING

FIG. 1 is a sectional view showing a high temperature, low ohmic contact metal contact assembly in accordance with the invention.

FIG. 2 is a sectional view schematically illustrating the refractory metal contact assembly with an interconnect metal layer.

FIG. 3 is a sectional view showing a portion of an integrated circuit including complementary MOS transistors and a multi-layer interconnect assembly in accordance with the invention.

DESCRIPTION OF PREFERRED EMBODIMENT

Figure 4A:
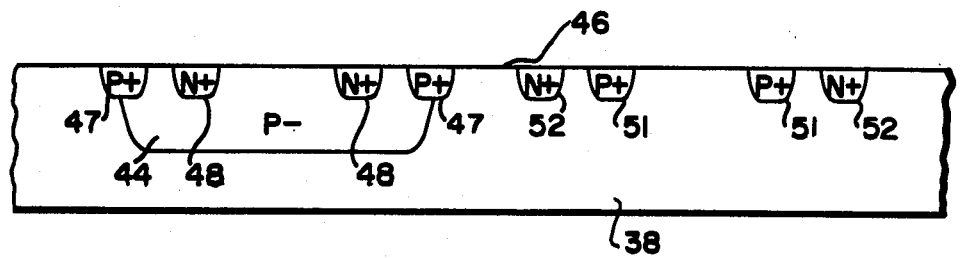
FIGS. 4A–D show the steps in fabricating the integrated structure of FIG. 3.

Referring to FIG. 1, a high temperature refractory metal contact assembly is shown on a silicon wafer or body 11. The contact assembly is applied on wafer 11 which includes an insulating layer 12 having a contact opening or aperture 13. A thin silicon layer 14 is disposed over the insulating layer and may extend within the aperture 13. A refractory metal electrical connector 15 interfaces the silicon layer and forms an ohmic contact with the underlying silicon body 11. The silicon layer provides an interface with the insulating layer whereby the refractory metal adheres to the surface. The refractory metal has substantially the same coefficient of thermal expansion as the wafer and insulating layer whereby to minimize differential expansion and possible cracking of the insulating layer. For simplicity of illustration, the silicon body is not shown with devices in several of the examples illustrative of the contact assembly. However, it will be apparent that the contact assembly is for making connection to devices in integrated circuits. A relatively thin silicon layer 16 is formed and carried by the upper surface of the refractory metal. The silicon layer is provided so that ohmic contact can easily be made to the refractory metal through the silicon interface. A metal interconnecting layer 17 is shown on the surface of the insulating layer and interconnected with the overlying thin silicon layer to form an ohmic connection to the refractory metal. As is well known, the patterned metal interconnecting layer 17 in integrated circuits and the like serves to interconnect between various devices formed in the silicon body or to associated circuits. More particularly, the high temperature, low ohmic contact assembly is a refractory metal sandwich including the silicon layer 14, intermediate refractive layer 15 which may be molybdenum, tungsten, platinum, nickel or paladium, and the upper silicon layer 16. The two silicon layers provide for good ohmic contact with the refractory metal. The relatively inert refractory metal sandwich withstands subsequent processing temperatures and operations without reacting and pitting or cracking the underlying oxide layer 12. Its importance will become more clearly apparent from the description to follow.

Referring to FIG. 2, the high temperature, low ohmic contact of FIG. 1 is shown in a multi-layer interconnection structure formed on a wafer or body 21. A first insulating layer 22 having a plurality of contact openings or apertures 23 is formed on a surface of body 21. A silicon layer 24 is formed over the exposed silicon body and insulating layer. A refractory metal layer 25 is formed over a portion of layer 24 between two contact apertures. A silicon layer 26 is formed on the upper surface of the refractory metal layer 25. Thereafter, a second insulating layer 29 is formed over the upper surface of the wafer. Contact holes or apertures 31, 32 are selectively formed in the second insulating layer with at least one, 31, extending from the top surface to silicon body 21 and at least one, 32, extending from the top surface to the upper surface of silicon layer 26. A conductive metal layer 33 such as aluminum is formed on the top surface of layer 29 to contact the silicon body 21 and silicon layer 26 through the contact holes or apertures 31 and 32 respectively. The aluminum layer is patterned to provide interconnection between portions of the silicon body 21 either directly or through the refractory contact assembly. It is seen that the refractory contact assembly includes the aluminum contact 35 to provide a multi-layered contact assembly.

The refractory contact assembly and metal interconnection of FIG. 2 is fabricated by starting with a silicon wafer or body 21. The first step is to form the insulating oxide layer 22, such as silicon dioxide, on a surface of body 21. This may be a thermal oxide approximately 12000 A thick grown at 12000° C. in a steam atmosphere. The next step is to mask and etch the exposed portion of the oxide layer to form the plurality of contact apertures 23. Silicon layer 24 is formed on the surface by sputtering or the like to a thickness of 500 A. The refractory metal layer 25 is then formed by masking and sputtering a refractory metal such as molybdenum, tungsten, platinum, nickel or palladium over selected portions of layer 22 and into the contact apertures 23 to interface with the exposed portions of layer 24 within said apertures. This layer is preferably in the range of 2000–5000 A thick. The next step is to sputter a second layer 26 of silicon of 500 A thick. The next step is masking the refractory metal layer 25 and etching an interconnect pattern. This silicon layer is approximately 500 A thick and provides a good stable interface with the insulating oxide. An insulating layer 29 is then formed over the entire upper surface. Insulating layer 29 may be formed as two layers, a first layer of silicon dioxide approximately 5000 A thick.

Contact holes or apertures 31 and 32 are selectively formed as by masking and etching the second insulating layer 29 with one aperture extending from the top surface to silicon body 21 and at least one extending from the top surface to the upper surface of silicon layer 26. The next step is forming a conductive metal layer 33, such as aluminum, on the upper surface of the wafer to extend into the apertures and contact the underlying silicon. This layer is formed in accordance with standard metallization techniques. The next step is selectively etching the metal layer to form a pattern which interconnects between portions of the silicon body and refractory contact assemblies.

Thus, it is seen that the process of the present invention adapts itself to the multi-layer interconnection of various active and passive devices formed in an integrated circuit. As will presently be shown, the high temperature, low ohmic contact assembly simplifies and increases the interconnection flexibility of a complementary MOS transistor structure.

Referring to FIG. 3, a further embodiment of the present invention is shown in an integrated circuit including complementary MOS transistors and a multi-layer interconnection structure with low ohmic refractory contact assembly. The complementary MOS transistor structure shown includes N channel field effect transistor 36 and P channel field effect transistor 37 formed in a silicon wafer or body 38. First layer 39 and second layer 41 are insulated interconnecting layers. The first layer 39 is a refractory metal layer assembly with one portion forming the gate electrode 42 of the N channel field effect transistor 36, and another portion the gate electrode 43 of the P channel field effect transistor 37.

More particularly, the N channel field effect transistor 36 includes a P− diffused region 44 extending into body 38 from surface 46. P+ diffused channel stops 47 extend from surface 46 into body 33 and merge with diffusion region 44 to surround and isolate the N channel field effect transistor 36. Spaced N+ regions 48 are diffused within region 44 to form source and drain regions of the N channel field effect transistor 36. A portion of first refractory metal layer 39 forms insulated gate electrode 42 which overlies the portion of surface 46 between spaced source and drain regions 48.

The P channel field effect transistor 37 includes spaced diffused P+ regions extending from surface 46 into body 33 to form source and drain regions 51 for the P channel field effect transistor. A portion of first refractory layer 39 forms insulated gate electrode 43 which overlies the portion of surface 46 lying between spaced source and drain regions 51. N+ diffused channel stops 52 extend from surface 46 into body 33 to surround and isolate P channel field effect transistor 37.

The multi-layer interconnection structure includes a first insulating layer 53 formed on surface 46, a silicon layer 54, a refractory layer 56 formed on the upper surface of layer 54 and a silicon layer 57. A second insulating layer 58 isolates a second patterned metal layer 59 formed on the upper surface of layer 58. The first and second metal layers are patterned to provide contacts with associated regions. The layers are apertured whereby the second metal layer selectively interconnects portions of the refractory layers and the transistor gate and source regions thereby forming an integrated circuit including bipolar MOS transistors.

Thus, there is formed an integrated circuit structure comprising complementary N channel and P channel field effect MOS transistors and a multi-layer interconnect structure having high temperature low ohmic to the transistors.

Figure 4B:
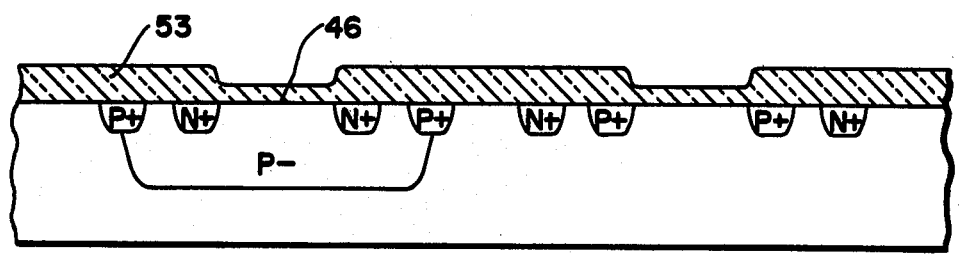
Figure 4C:
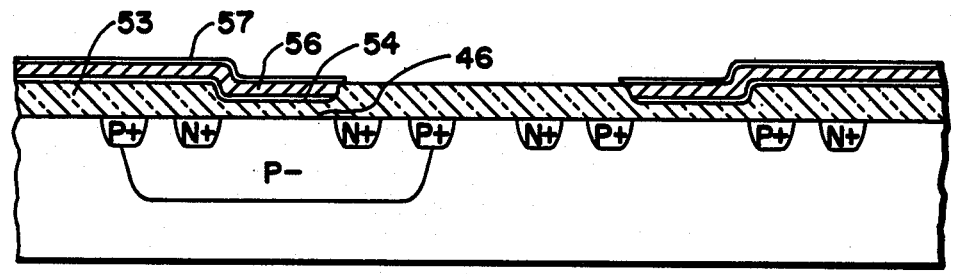
Figure 4D:
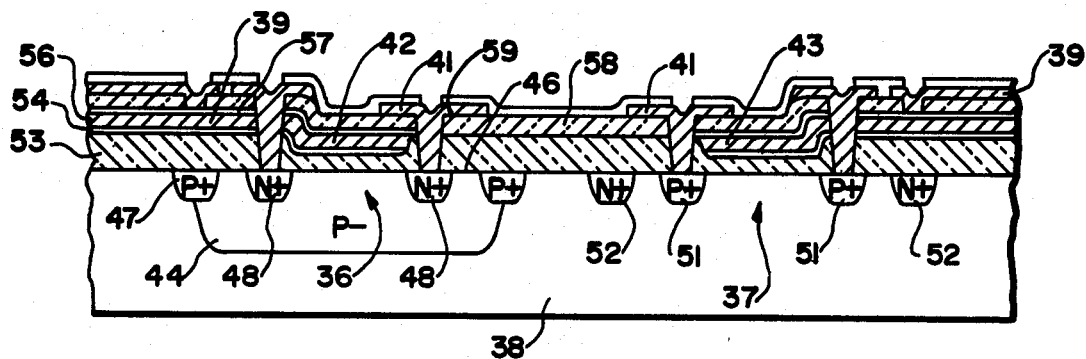

Referring now particularly to FIGS. 4A-4D, the steps of forming the above described integrated circuit are illustrated. The steps of masking, etching, diffusing are well known in the art and, therefore, these steps will only be briefly described in connection with the processing steps.

Starting with a 1-5 ohm cm. N type body 38 having a first surface 46, FIG. 4A, the first step is to mask and diffuse the P— region 44. Ths is a deep diffusion of light boron concentration. The next step is masking and simultaneously diffusing the P+ source and drain regions 51 for the P channel transistor 37 and the P+ channel stops 47 for the N channel transistor 36. The next step is masking and simultaneously diffusing the N+ source and drain regions 48 for the N channel transistor 36 and the N+ channel stops 52 for the P channel transistor 37.

Following this step, the diffusion regions are covered by growing an oxide layer 53 uniformly over the surface 46. The next step is removing the oxide between and overlying the spaced source and drain regions of each transistor thereby defining the gate region. The next step is growing a relatively thin gate oxide layer covering said gate region FIG. 43.

Following this step, the refractory metal layer assembly is formed. The assembly is a refractory metal sandwich comprising three materials sequentially formed on the oxide layer 53. The first sequential step is forming a thin silicon layer 54. The next step is forming a refractory metal layer 56 such as molybdenum, tungsten, platinum nickel or palladium on layer 54. The following step is forming a second silicon layer 57 on the refractory metal 56. The next step is masking and separating the refractory metal sandwich into the desired first layer interconnect pattern using standard techniques to form an interconnect touching the gate oxide of each gate, FIG. 4C. The next step is coating the wafer surface with an insulating layer 58, such as silicon dioxide, FIG. 4D. A silicon nitride layer could be formed on the insulating layer providing a very dense pinhole-free dielectric separation between the first and second metal layers. The following step is masking and forming apertures, such as by etching, to form the desired contact apertures extending from the upper surface to the first metallization layer and to form the desired contact apertures extending from the upper surface to the upper surface of transistor regions to contact the source and drain regions.

The next step is forming on the wafer surface an aluminum layer 41 approximately 12,000 A thick and simultaneously forming aluminum in the contact holes to form conductive paths extending to the wafer to contact the silicon top layer 57 of the refractory metal sandwich. The next step is separating the aluminum layer into the desired second layer interconnect pattern using standard techniques. The next step is sintering the structure at approximately 500° C. so that the aluminum forms good contact with the silicon.

The next steps are forming on the upper surface a low temperature insulating protective layer such as silicon dioxide, and masking and etching to expose the aluminum interconnect to make connections thereto as by conventional gold wires.

Thus, it is seen that the process of the present invention adapts itself to the formation of multiple interconnect layers providing high temperature, low ohmic contacts and aluminum interconnect. The processes herein described can form interconnects to additional active devices such as bipolar devices, Schottky diodes, resistor and other passive device structures.

I claim:

1. A method of forming a complementary MOS integrated circuit structure comprising the steps of:
   providing an N type silicon body having a surface,
   forming a P— region in the surface of the body,
   forming spaced N+ regions within the P— region,
   forming spaced P+ regions in the surface of the body,
   forming isolation rings in the surface of the body surrounding and isolating said transistors,
   forming a first insulating layer on the surface of the body,
   forming a refractory metal sandwich on the upper surface of the first insulating layer,
   formation of said sandwich including the steps of forming a first silicon layer on the upper surface of the first insulating layer, forming a relatively thin refractory metal layer on the first silicon layer, and forming a second silicon layer on the upper surface of the refractory metal layer,
   providing one portion of the refractory metal sandwich which overlies the body surface between the spaced P+ regions to form the P channel transistor gate,
   providing another portion of the refractory metal sandwich which overlies the body surface between said spaced N+ regions to form the N channel transistor gate,
   forming a second insulating layer on the upper surface of the refractory metal sandwich,
   forming an additional metal layer on the upper surface of the second insulating layer,
   selectively dividing the refractory metal sandwich and the additional metal layer into portions having interconnecting segments which extend through intervening layers to selectively interconnect portions of the metal layers and selectively contact the upper surface of the transistor regions to form an integrated circuit.

* * * * *